(12) United States Patent
Porter (10) Patent No.: US 9,753,110 B2
(45) Date of Patent: Sep. 5, 2017

(54) METHOD AND MAGNETIC RESONANCE SYSTEM FOR ACQUIRING MAGNETIC RESONANCE DATA (71) Applicant: Siemens Aktiengesellschaft, Munich (DE)

(72) Inventor: David Andrew Porter, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 410 days.

(21) Appl. No.: 14/495,146

(22) Filed: Sep. 24, 2014

(65) Prior Publication Data
US 2015/0084629 A1    Mar. 26, 2015

(30) Foreign Application Priority Data
Sep. 24, 2013   (DE) .................. 10 2013 219 120

(51) Int. Cl.
*G01R 33/54* (2006.01)
*G01R 33/483* (2006.01)
(Continued)

(52) U.S. Cl.
CPC ......... *G01R 33/54* (2013.01); *G01R 33/4835* (2013.01); *G01R 33/5611* (2013.01);
(Continued)

(58) Field of Classification Search
CPC ............. G01R 33/54; G01R 33/4835; G01R 33/5611; G01R 33/56341; G01R 33/56509; G01R 33/5676
See application file for complete search history.

(56) References Cited

U.S. PATENT DOCUMENTS 6,614,225 B1   9/2003 Feinberg
7,205,763 B2   4/2007 Porter
(Continued)

OTHER PUBLICATIONS

Larkman et al., "Use of Multicoil Arrays for Separation of Signal from Multiple Slices Simultaneously Excited", Journal of Magnetic Resonance Imaging, vol. 13, pp. 313-317 (2001).
(Continued)

*Primary Examiner* — Gregory H Curran
(74) *Attorney, Agent, or Firm* — Schiff Hardin LLP (57) ABSTRACT

In a method for acquiring magnetic resonance data with a magnetic resonance system using a magnetic resonance sequence, the sequence has a first partial sequence in which magnetic resonance data are acquired for multiple slices that have to be acquired simultaneously, from which image data for the individual slices are calculated by a reconstruction algorithm. The sequence also has a second partial sequence for determining additional data, which are used to evaluate and/or assess the magnetic resonance data, and which have a spatial resolution that is lower than the magnetic resonance data, in which radio-frequency pulses and readout processes take place in a slice-specific manner through a time offset within a single measuring process, in which a single continuous excitation period with the radio-frequency pulses and a single continuous readout period with the readout processes follow one another, so that separate additional data are directly determined for each slice.

10 Claims, 3 Drawing Sheets

(51) Int. Cl.
G01R 33/561 (2006.01)
G01R 33/563 (2006.01)
G01R 33/565 (2006.01)
G01R 33/567 (2006.01)

(52) U.S. Cl.
CPC .... *G01R 33/5676* (2013.01); *G01R 33/56341* (2013.01); *G01R 33/56509* (2013.01)

(56) References Cited

U.S. PATENT DOCUMENTS

| | | | |
|---|---|---|---|
| 7,417,427 B2 | 8/2008 | Porter | |
| 9,138,162 B2* | 9/2015 | Stemmer | A61B 5/055 |
| 2007/0249929 A1* | 10/2007 | Jeong | G01R 33/5615 |
| | | | 600/410 |
| 2011/0254548 A1 | 10/2011 | Setsompop et al. | |
| 2013/0211234 A1* | 8/2013 | Moghari | A61B 5/055 |
| | | | 600/413 |
| 2013/0307538 A1 | 11/2013 | Pfeuffer et al. | |

OTHER PUBLICATIONS

Porter et al., "High Resolution Diffusion-Weighted Imaging Using Readout-Segmented Echo-Planar Imaging, Parallel Imaging and a Two-Dimensional Navigator-Based Reacquisition", Magnetic Resonance in Medicine, vol. 62, pp. 468-475 (2009).

Griswold et al., "Generalized Autocalibrating Partially Parallel Acquisitions (GRAPPA)", Magnetic Resonance in Medicine, vol. 47, pp. 1202-1210 (2002).

Breuer et al., "Controlled Aliasing in Parallel Imaging Results in Higher Acceleration (CAIPIRINHA) for Multi-Slice Imaging", Magnetic Resonance in Medicine, vol. 53, pp. 684-691 (2005).

Setsompop et al., "Blipped-Controlled Aliasing in Parallel Imaging for Simultaneous Multislice Echo Planar Imaging With Reduced g-Factor Penalty", Magnetic Resonance in Medicine, vol. 67, pp. 1210-1224 (2012).

Frost et al., "Reduction of Diffusion-Weighted Readout-Segmented EPI Scan Time Using a Blipped-CAIPI Modification", Magnetic Resonance in Medicine, vol. 20, p. 116 (2012).

* cited by examiner

METHOD AND MAGNETIC RESONANCE SYSTEM FOR ACQUIRING MAGNETIC RESONANCE DATA

BACKGROUND OF THE INVENTION

Field of the Invention

The invention relates to a method for acquiring magnetic resonance data with a magnetic resonance system using a magnetic resonance sequence wherein, in a first partial sequence, magnetic resonance signals are acquired from multiple slices simultaneously. From these magnetic resonance signals, magnetic resonance data for the individual slices are calculated with a reconstruction algorithm. In addition, the invention relates to a magnetic resonance system for implementing such a method.

Description of the Prior Art

In magnetic resonance imaging, it is generally known to detect different slices in a target object from which magnetic resonance data are acquired. This type of magnetic resonance imaging is also called two-dimensional magnetic resonance imaging, because the slices are reproduced in two-dimensional magnetic resonance images. Techniques are known that make it possible to acquire multiple slices simultaneously in order to reduce the repetition time (TR) and the total acquisition time. In particular, these techniques are advantageous when the standard protocol, i.e., without simultaneous acquiring of multiple slices, involves a long repetition time.

In this case, the reduction of the repetition time, which was introduced with the implementation of a simultaneous acquisition of multiple slices, does not result in significant spin saturation effects, and the reduction of the total acquisition time can be achieved with minimal losses in the signal-to-noise ratio (SNR).

Two basic techniques for simultaneous acquiring of multiple slices are known.

In a first of these techniques, described in detail in U.S. Pat. No. 6,614,225, slight temporal offsets between slice-specific excitation and refocusing pulses are used to achieve temporal offsets between the echoes of each individual slice to a single excitation signal. Subsequently, these echoes can be scanned separately so that the resulting magnetic resonance signals can be assigned to the correct slice.

The second known method for simultaneous imaging of multiple slices utilizes modified radio-frequency pulses to excite and refocus the magnetization of several different slices in an actually simultaneous manner. The resulting echoes are also produced simultaneously so that the scanned magnetic resonance signals contain superimposed individual signals of the different slices. Subsequently, the signal of the individual slices can be separated by using position-dependent information of multiple receiving coils, see, for example, the article by D. J. Larkman et al., "Use of multi coil arrays for separation of signal from multiple slices simultaneously exited", J. Magn. Reson. Imaging 13: 313-317 (2001). Therefore, this involves the use of so-called "parallel imaging", in which the magnetic resonance signals of several acquisition (receiving) coils are acquired and evaluated. For example, at the same time, it is possible to perform subsampling to reduce the entire acquiring time, wherein it is still possible to determine missing information by the magnetic resonance signals of several coils. In this context, the term subsampling is used for subsampling in "in-plane" direction (for example, the y-direction). For each slice, reference data are also used, which can be determined in the usual manner, i.e., without simultaneous acquiring of several slices, optionally with lower spatial resolution, and which are used to determine the magnetic resonance data of different simultaneously acquired slices.

The GRAPPA technique is a frequently used version of such parallel imaging, see, for example, the article by M. A. Griswold et al., "Generalized autocalibrating partially parallel acquisitions (GRAPPA)", Magn. Reson. Med. 47 (6): 1202-1210 (2002). The slice GRAPPA technique does not necessarily use a subsampling method, but when acquiring data a complete scan is performed, which, however, involves superimposed individual signals of multiple slices. However, it is known to produce a type of artificially subsampled data set by duplicating during data processing the field of view (FOV), for example, in the y-direction. As a result, the offset image of the individual slices is no longer subject to the aliasing effect within the small FOV.

The so-called CAIPIRINHA method has been proposed as an especially useful and important extension for the basic idea of simultaneous excitation and refocusing. It has been described in an article by F. A. Breuer et al., "Controlled aliasing in parallel imaging results in higher acceleration (CAIPIRINHA) for multi-slice imaging", Magn. Reson. Med. 53: 684-691 (2005). This method, the magnetic resonance sequence is modified, resulting in a slice-specific, in-plane offset of the image pixels. This modification improves the performance of the reconstruction algorithms, which are used to separate the individual signals of the different slices present in the magnetic resonance signal, for example, the well-known slice GRAPPA algorithm. A variation of this method is used for echo planar imaging (EPI), which is known as "blipped CAIPIRINHA", see, for example, US 2011/0254548 A1 or the article by K. Setsompop et al., "Blipped-controlled aliasing an parallel imaging for simultaneous multislice echo planar imaging with reduced g-factor penalty", Magn. Reson. Med. 67: 1210-1224 (2012).

It has been proposed to combine the ("blipped") CAIPIRINHA method for simultaneous imaging of multiple slices, which uses short gradient pulses, with the diffusion-weighted, readout-segmented echo planar imaging sequence (rs-EPI—readout-segmented echo planar imaging), see, for example, U.S. Pat. No. 7,205,763 or the article by D. A. Porter et al., "High resolution diffusion-weighted imaging using readout-segmented echo-planar imaging, parallel imaging and a two-dimensional navigator-based reacquisition", Magn. Reson. Med. 62: 468-475 (2009). Examinations, as described, for example, in an article by R. Frost et al., "Reduction of diffusion-weighted readout-segmented EPI scan time using a blipped-CAIPI modification", Proc. Annual Meeting of ISMRM 2012, abstract 116, show that the combination of these two methods provide a diffusion-weighted imaging technique with improved image quality when compared to standardized single shot echo planar imaging (ss-EPI—single shot EPI), while a short total acquisition time, which is acceptable for routine examinations in medical operations, is achieved.

In this context, the use of real time feedback based on navigators also has been proposed, see, for example, the above-mentioned article by D. A. Porter et al., or U.S. Pat. No. 7,417,427 B2. The acquisition of navigators forms a second partial sequence of the magnetic resonance sequence, which shares the excitation signal emitted in the first partial sequence for acquiring the actual magnetic resonance data, and which uses a new refocusing pulse and a new readout time period. Usually, a navigator feedback is used in connection with the rs-EPI-sequence or other diffusion-weighted magnetic resonance sequences to identify and newly measure readout segments with strong, movement-induced phase errors, if they cannot reliably be corrected by a correction, for example, a phase correction, taking into consideration the two-dimensional navigators. In this way, bulk movements of the entire acquiring area are prevented from greatly distorting the diffusion determination. In the context of brain imaging the strong phase errors have a highly non-linear performance resulting from a brain non-uniformity due to pulsating cerebrospinal fluid (CSF). This makes it possible to identify the readout segments affected by measuring the breadth of magnetic resonance distribution in k-space, even when subsampled magnetic resonance data sets are recorded using parallel imaging, for example, with the use of GRAPPA technique. This simple possibility for identifying affected readout segments is especially useful for real time measurements, because the magnetic resonance data (navigator data) concerning the navigators can be evaluated without the computational expense of a complete image reconstruction, which usually requires a multitude of steps, especially rebinning for non-equidistant $k_x$ scan points and using a parallel imaging algorithm.

However, simultaneous imaging of several slices, as discussed above, involves a problem, because the raw data, i.e., the navigator magnetic resonance signals, also contain the superimposed individual signals of multiple slices in the navigator. Therefore, it is less easy to identify the slice-specific phase errors, even when the magnetic resonance signals of different reception coils are evaluated separately, which provides a certain spatial dependency of the magnetic resonance signals. In principle, it would be possible to apply the reconstruction algorithm, for example, a slice GRAPPA algorithm, also to the navigator data, but this would have to take place in real time in order to control, by means of the navigator data, the acquisition process and especially the remeasuring processes. This real time application of the reconstruction algorithm would involve extremely high computational demands because, for most reconstruction algorithms, reference data are required that have to be processed, and the extraction of slice-specific navigator data, as well as the processing of reference data, would have to take place in real time.

For example, the application of the slice GRAPPA algorithm ("slice GRAPPA") requires a set of reference data concerning the central readout segment, which is usually acquired by using a standardized multi-slice acquisition technique without simultaneous imaging. A basic problem of this additional acquisition of reference data involves additional acquisition time, which is required for acquiring the reference data.

SUMMARY OF THE INVENTION

An object of the invention is to provide an improved technique for acquiring additional data, which is especially time-saving and/or results in a better quality of the magnetic resonance data, and which supports the evaluation and/or assessment of magnetic resonance signals.

According to the invention, this object is achieved by a method for acquiring magnetic resonance data with a magnetic resonance system using a magnetic resonance sequence, wherein the magnetic resonance sequence includes a first partial sequence in which several magnetic resonance signals are detected that represent multiple slices which have to be recorded simultaneously. From those magnetic resonance signals, magnetic resonance data for the individual slices are calculated by a reconstruction algorithm. The sequence also includes a second partial sequence for determining additional data, which are used to evaluate and/or assess the aforementioned magnetic resonance data, and that have a spatial resolution that is less than the resolution of the magnetic resonance data, in which radio-frequency pulses and readout processes are activated in a slice-specific manner through a time offset within a single measuring process, in which a single, continuous excitation period with the radio-frequency pulses, and a single, continuous readout period with the readout processes, follow one another, so that separate sets of additional data are directly determined for each slice.

The invention makes use of the fact that the additional data have a spatial resolution that is lower than the magnetic resonance data. As a result, the duration of a readout process for the additional data is considerably shorter than the duration of a readout process for the magnetic resonance signals on which the diagnostic magnetic resonance data are based, because only a central part of k-space is read. For example, magnetic resonance sequences are known in which the readout process for the magnetic resonance signals in the first partial sequence requires 40 ms. However, a readout process for additional data, for example, navigator data, in the second partial sequence requires only 10 ms. This means that it is possible for the additional data to be used for several readout processes for the different slices and beforehand several successive radio-frequency pulses, so it is possible, for example, to measure two or three slices of the magnetic resonance signals that have to be simultaneously evaluated as magnetic resonance data, without risking that the total acquisition time of the magnetic resonance sequence is considerably extended, or that T2 effects are increased, as would occur if such a procedure were to be used for the magnetic resonance signals on which the diagnostic magnetic resonance data are based, or if the diagnostic magnetic resonance data itself were to be used for such a purpose.

Practically, the additional data could be used as navigators and/or as reference data for the reconstruction algorithm, especially in the context of diffusion-weighted imaging, because the most advantageous embodiment for diffusion-weighted imaging involves use of such additional data for both as navigator data and reference data.

Therefore, in an embodiment, the additional data acquired in accordance with the invention are used as navigator data by subject movement information being determined therefrom in real time for different acquisition segments of the magnetic resonance signals and/or magnetic resonance data, this movement information describing movements of the subject in the imaging volume of the magnetic resonance apparatus, and the movement information is evaluated with regard to the remeasurement of individual segments or for correction of the magnetic resonance data. As explained above, acquiring navigator data in a second partial sequence of the magnetic resonance sequence is basically a well-known process, but in the prior art navigator signals are acquired for several slices, just as magnetic resonance signals have to be evaluated for magnetic resonance data, and initially the reconstruction algorithm would have to be used—naturally in real time—which would result in an enormous computational effort. According to the invention, as usual, the magnetic resonance signals are scanned simultaneously in the first partial sequence, but the navigator echo signals are acquired with a time offset so as to make it possible for the different slices to be scanned independently in the second partial sequence. This time offset or the mutual time shift is achieved by using individual slice refocusing pulses to adjust the temporal center of the navigator echo differently for each slice. The navigator data, i.e., the additional data, resulting from the acquisition can be used in real time without further processing, and the reconstruction algorithm merely has to be applied to the magnetic resonance signals where the results are not required in real time.

As described above, the navigator data are acquired with lower spatial resolution; for example, in k-space only an area around the k-space center is scanned, which extends equally in the x and y directions. This results in the above-mentioned shorter readout period because the spatial resolution is restricted at least in the phase coding direction. This results only in a small increase of the total time that is required to acquire the navigator data so that, in the exemplary case of a simultaneous acquisition of two slices the acquisition time has to be extended by approximately 5% only one time.

When the navigator data are obtained even in slice-related manner, it is possible, for example, that phase errors that indicate movements in the imaging volume during the process of applying the diffusion coding gradients, and/or position offsets that can result in spatial wrong registrations between data of different excitations, can be determined quickly and easily, and used to perform corrections or to evaluate whether a readout segment in k-space has to be repeated anew. In an only minimally extended acquisition time, the computational expense is considerably reduced.

Alternatively or preferably, the additional data can be used as reference data for the reconstruction algorithm to be applied to the diagnostic magnetic resonance signals. As a result, it is no longer required to perform a separate reference scan for each individual slice at the beginning of the measurement. When the additional data are used as reference data and navigator data, the double use of the additional data can compensate a potentially occurring time loss for the slice-by-slice acquisition of the navigator data.

Using the additional data as reference data has additional advantages. It is possible to prevent artifacts, which could occur by moving the acquisition area that is reproduced through the magnetic resonance data between the acquisition of the reference data, and the magnetic resonance signals, because the reference data and the magnetic resonance signals are acquired in a single magnetic resonance sequence, particularly after a single excitation signal. In addition, there is a special advantage in connection with diffusion examinations, wherein reference images recorded at the beginning of the imaging process are in clear contrast to the diffusion-weighted images, the contrast of which varies as a function of strength, duration and direction of the applied diffusion coding gradients. Under specific imaging conditions, some reconstruction algorithms, for example, the slice GRAPPA algorithm, are sensitive to the underlying image contrast. In such a case, the additional data used as reference data provide a more robust determination of the magnetic resonance data because they have the same diffusion contrast as the corresponding magnetic resonance data of the slices acquired simultaneously in the first partial sequence.

In summary, the present invention provides a modification of well-known magnetic resonance sequences that acquire magnetic resonance signals that form a superposition of individual signals originating from several slices by additional data being acquired as different readout events, i.e., in different readout processes, so that it is no longer required to apply the reconstruction algorithm to the additional data, especially in the case of navigator data.

The magnetic resonance sequence, composed of the first and the second partial sequences, is a continuous, connected data acquisition procedure that uses a radio-frequency signal as a single excitation signal emitted at the beginning of the first partial sequence, which means that the radio-frequency pulses of the second partial sequence are refocussing pulses. The first partial sequence an excitation pulse is emitted, for example, with a flip angle of 90°, which affects all slices to be recorded simultaneously, which is followed by a refocussing pulse, for example, with a flip angle of 180°, which affects all slices to be simultaneously recorded. In the second partial sequence, individual refocussing pulses are emitted that are related to the individual slices and temporally offset against each other, for example, with a flip angle of 180°, which lead to successive readout processes, i.e., readout time windows, for the different slices.

To achieve a special advantage, during the second partial sequence at least one gradient pulse, in particular a spoiler gradient pulse, is switched (activated) that suppresses, in particular dephases, additional signals of other slices during the readout process. In this way, magnetic resonance signals (for the second partial sequence generally called additional signals) of other slices are prevented from being acquired (detected) in the measurement of the additional data of a particular slice, such as by superimposing on the additional signal of the slice currently measured. Therefore, the gradient pulses along the slice selection direction, the readout direction and/or the phase coding direction can be designed such that the additional signals of other slices suppressed, i.e., dephased, optionally also by adding further gradient pulses, when the additional signal of a specific slice are scanned for determining the slice-specific additional data. For example, a readout process for a slice can be connected upstream with at least one gradient pulse that reconnects the phase of the additional signals of the slice and dephases the additional signals of the other slices. The determination of such gradient pulses or the modification of the pulse form of existing gradient pulses to achieve such a suppressing effect for the respective periods is basically known because it forms the basis for the sequence design.

The inventive method can be applied with particular advantage when the magnetic resonance sequence is an rs-EPI-sequence modified for the "blipped" CAIPIRINHA technique and/or a slice GRAPPA algorithm is used as reconstruction algorithm. The "blipped CAIPIRINHA" technique, the rs-EPI-sequence and the slice GRAPPA algorithm are largely known in the prior art, as shown in the documents mentioned above. They are combined to obtain a method that supplies extremely advantageous and high quality data for diffusion-weighted imaging. This method is further improved by the navigator data and the reference data being acquired as additional data in accordance with the inventive method.

In addition to this method, the present invention concerns to a magnetic resonance system having a control device designed to perform the inventive. The control device of the magnetic resonance system is designed to control the magnetic resonance system for generating and emitting, as control signals, the magnetic resonance sequence composed of the first partial sequence and the second partial sequence and to acquire corresponding magnetic resonance signals and additional data, for which, preferably, multiple receiving coils are provided. The basic structure of magnetic resonance systems is well-known to those of skill in the art and thus need not be described herein detail. All embodiments regarding the inventive method can apply analogously to the inventive magnetic resonance system with which the same advantages can be obtained.

DESCRIPTION OF THE PREFERRED EMBODIMENTS

Figure 1:
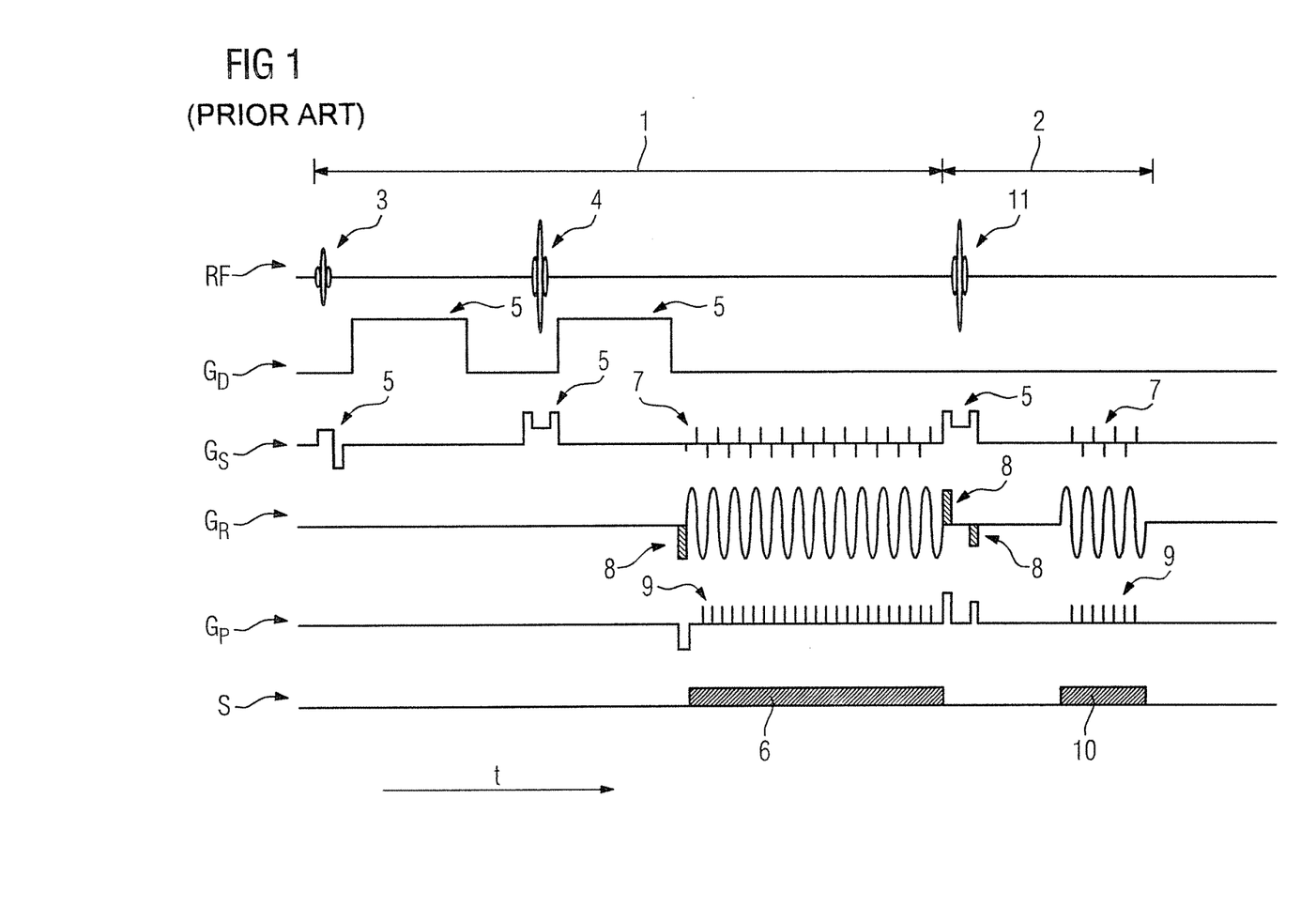
FIG. 1 shows an rs-EPI-magnetic resonance sequence according to the prior art.

FIG. 1 shows the basic rs-EPI-magnetic resonance sequence known from the prior art for the purpose of acquiring magnetic resonance data for diffusion-weighted imaging. In this embodiment, magnetic resonance signals of two slices should be recorded simultaneously in the manner known from the prior art, which means that the measured magnetic resonance signal is composed of the superimposed individual signals of both slices. In order to separate the individual signals and thus obtain the slice-specific magnetic resonance data, the well-known slice GRAPPA algorithm is used as a reconstruction algorithm. It is generally known that for the computation of coefficients this requires slice-specific reference data relating to the slices to be acquired. In the magnetic resonance sequence known in the prior art, which is shown in FIG. 1, the reference data are acquired in the conventional manner at the beginning of the total measurement in that each of the two slices is excited individually and the reference data for each slice are acquired separately.

The magnetic resonance sequence of the prior art can be divided into two partial sequences, namely a first partial sequence 1 in which the magnetic resonance signals from which the magnetic resonance data for the individual slices are obtained from the reconstruction algorithm are acquired, and a second partial sequence 2 in which navigator data are to be obtained for the slices in order to detect and correct phase errors resulting from the movement of the acquiring area, or to activate a reopening of affected readout segments in k-space. In the process, the "blipped CAIPIRINHA" technique is used for simultaneous imaging in multiple slices.

The pulses and time windows shown in the diagram of FIG. 1 from top to bottom first relate to the radio-frequency (RF) pulses, the diffusion coding gradients $G_D$, the slice selection gradients $G_S$, the readout gradients $G_R$, the phase coding gradients $G_P$ and the reading of data (S—sampling). The magnetic resonance sequence shown first uses, in the first partial sequence, a radio-frequency excitation pulse 3 with a flip angle of 90°, which acts on both slices to be measured simultaneously. This is followed by a radio-frequency refocussing pulse 4, which affects both slices to be measured simultaneously and that has a flip angle of 180°. The respectively assigned gradient pulses 5 are well-known in prior art. In the readout process of the first partial sequence 1 denoted by the readout time window 6, the magnetic resonance signals of both slices are acquired, which means that the individual signals of the slices are superimposed. At the same time, in a slice selection direction, a gradient is applied that has alternating, extremely short gradient pulses 7 (this is where the term "blipped" originated), in order to achieve a slice-dependent signal offset along the phase coding direction, which improves the actual separation between voxels affected by aliasing effects, and thus the quality of the reconstruction algorithm, namely the slice-GRAPPA algorithm, which is shown, for example, in the above-mentioned US 2011/0254548 A1 and the article by K. Setsompop et al.

The gradient pulses 8 according to FIG. 1 applied in the readout direction are selected such that the imaging echo scans a different readout segment for each shot. Therefore, a different k-space-offset exists along the $k_x$ direction, and the navigator signal acquired in the second partial sequence 2 basically scans the center of k-space (no offset in the $k_x$ direction). It is generally known that in the phase coding direction a gradient is switched, which is composed of extremely short, temporally equidistantly spaced gradient pulses 9 ("blips") to scan with each shot the complete k-space in the $k_y$ direction.

As indicated, navigator signals are acquired in the second partial sequence in a readout process that takes place in the readout time window 10. For this purpose, in the magnetic resonance sequence of the prior art shown in FIG. 1, a radio-frequency refocusing pulse 11 is radiated, usually with a flip angle of 180°, which has an effect on both slices to be acquired. Correspondingly, the navigator signal is also read by using respective gradient pulses 7, 9 (wherein, as described above, here only a limited portion of k-space is scanned in the $k_y$ direction) and contains superimposed individual signals of the slices. The spatial resolution of the two-dimensional navigator is lower than that of the image to be derived from the magnetic resonance data. As a result, the EPI echo train used for scanning the navigator echo is temporally shorter than the echo train for the imaging echo, in which the magnetic resonance signal on which the diagnostic magnetic resonance data are based, is acquired.

In order to use the original navigator signal or the navigator data derived therefrom, and to estimate movement effects, for example, phase errors that occur due to movements of the subject during the application of the diffusion coding gradient and position shifts in relation to different excitations, it is possible to directly use the navigator signals relating to both slices without trying to separate the slice-specific individual signals. However, this makes it extremely difficult to detect slice-specific phase changes in the navigator data resulting from superimposed signals of the other slice. A different approach involves applying the reconstruction algorithm also to the navigator signal to obtain slice-specific navigator data, but this requires an extremely high computational outlay and is very difficult to achieve in real time. Such real time performance is required, however, because, from the navigator data, it is desired it is desired to determine the occurring extreme phase errors, such that a reacquisition of specific readout segments in k-space has to be implemented.

A further problem of the magnetic resonance sequence of the prior art shown in FIG. 1 is that an additional acquisition process for the reference data, required for the reconstruction algorithm, is executed, which uses additional time and, in the shown case of diffusion-weighted imaging, it is executed with completely different contrasts. It is also possible for a movement to occur between acquisition of the reference data and the diagnostic magnetic resonance signals, which could possibly cause problems.

Figure 2:
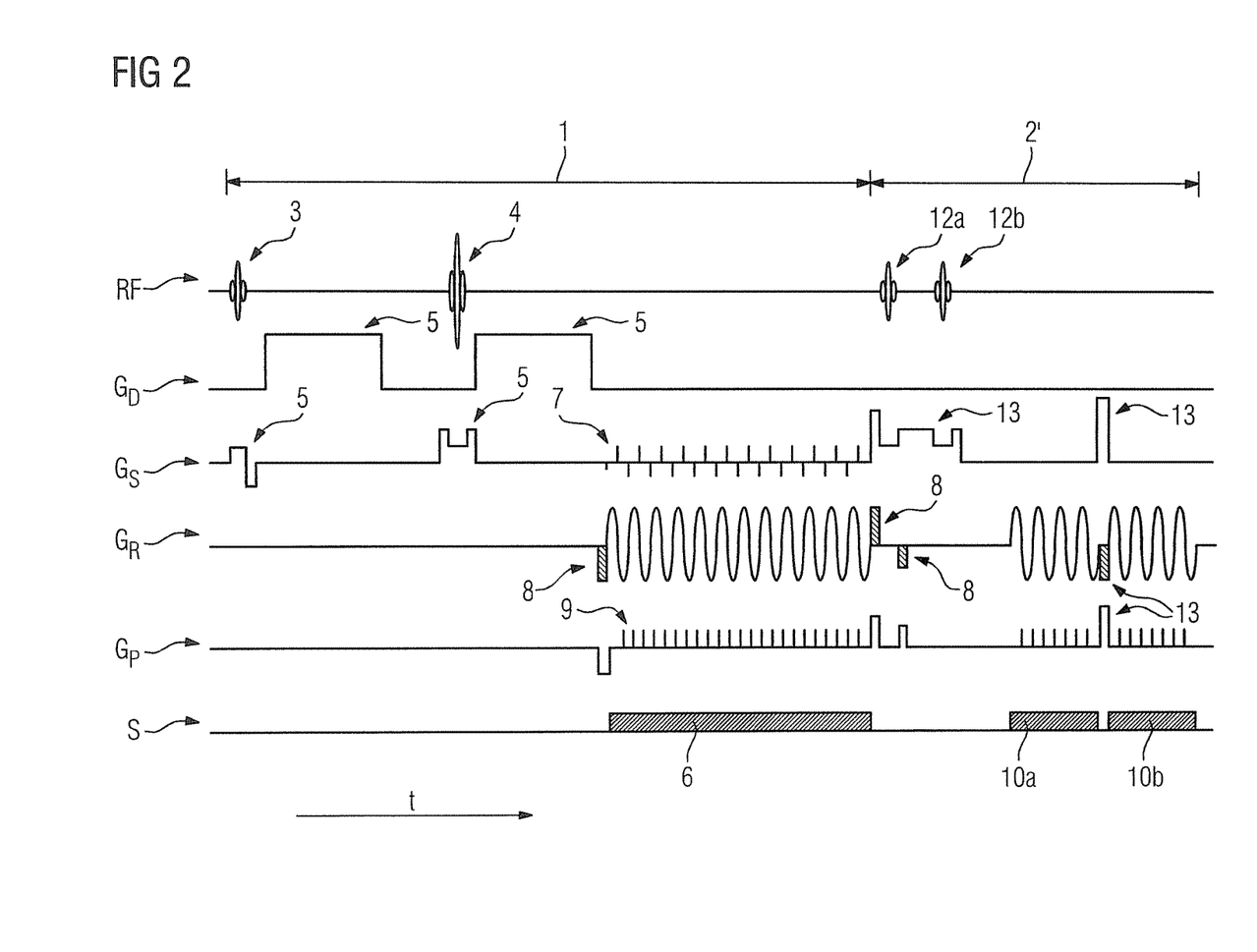
FIG. 2 shows a magnetic resonance sequence used in the inventive method.

All these problems are eliminated by modifying the magnetic resonance sequence with the inventive method shown in FIG. 2, which uses this magnetic resonance sequence to record magnetic resonance data. The inventive method does not modify the first partial sequence 1 and only provides a modified second partial sequence 2'. Therefore, the reference numerals of FIG. 1 are also used for the corresponding pulses in FIG. 2.

It is clear that in contrast to FIG. 1, in the second partial sequence 2', there is occurrence of the mutual refocusing pulse 11. Instead, two refocusing pulses 12a and 12b, each relating to a respective slice are provided, which are temporally offset but continue to start with the excitation pulse 3. This makes it possible, as indicated by separate readout time windows 10a 10b, to directly read navigator data, which respectively relate to a particular slice, in different readout processes, which are also temporally offset from each other, without requiring, by data processing, a separation of individual slice contributions to a single set of data, as in the prior art represented in FIG. 1. This is supported by the specific design and special provision of the gradient pulses 13, wherein the gradient pulses 13 are interacting along the slice selection direction, readout direction and phase coding direction so that the magnetic resonance signal (additional signal or here also navigator signal) of the respectively other slice that is not to be scanned is suppressed or concretely dephased. Therefore, in the readout time windows 10a, 10b, which are temporally offset from each other, only the magnetic resonance signal relating to the respective slice is read as navigator signal, or in this case the additional signal in general based on the further use of the obtained data. Direct navigator data or general additional data are thus individually obtained for each slice.

As a result, the echo signals in the second partial sequence are temporally offset from each other so that they can be scanned independently. In the process, use is made of the fact that the navigator data (or general additional data) have a lower resolution and therefore the region scanned in k-space around the k-spatial center is smaller than in the k readout time window 6. As a result, the period of the readout time window 10 is required twice. However, the total period of the magnetic resonance sequence is not significantly extended but, for example, currently only by approximately 5. Instead, the slice-specific additional data acquired in the second partial sequence 2' can be directly processed as navigator data in order to evaluate and possibly correct the data acquiring in the readout segments of k-space or to initiate a new acquisition. The reconstruction algorithm does not have to be applied. This results in a problem-free and economical evaluation in real time.

However, in the present case, the additional data recorded in the second partial sequence 2' are also used as reference data for the reconstruction algorithm, i.e., the slice GRAPPA algorithm to obtain the slice GRAPPA coefficients which are required to extract the slice-specific individual signals as magnetic resonance data. This removes the necessity of a separate reference measurement at the beginning of the complete scan. Depending on the specific protocol that is used, this can reduce the time for the complete scan that compensates the increased time for the second partial sequence 2'.

With regard to the reference data, this use of the additional data as navigator data, as well as reference data, or in this case the use of the navigator data also as reference data, has the additional advantage that artifacts are prevented through a movement of the acquisition area between the reference measurement and the magnetic resonance sequence shown here. Moreover, the diffusion-weighted imaging shown here has the advantage that the reference data correspond in their contrast to the magnetic resonance signals to be processed on which the magnetic reference data are based, resulting in a more robust application of the reconstruction algorithm.

Naturally, the principles shown here can be applied to more than two slices which are simultaneously acquired in a magnetic resonance sequence. In addition, the idea can be applied to techniques that differ from the imaging techniques described herein.

In summary, the magnetic resonance signals, i.e., the actual image echoes from which the magnetic resonance data are derived, and the magnetic resonance signals (navigator signals or general additional data) used as navigator, i.e., the navigator echoes, are acquired under different conditions, because the imaging echoes are scanned in a well-known manner by simultaneous data scanning of individual slices, but the navigator data of each of the slices are scanned individually at different times, by different radio-frequency refocusing pulses 12a and 12b respectively for the individual slices are used to achieve a slice-specific temporal offset between the spin echoes. As a result, the slice-specific navigator data are directly available for real time computation and can also be used as reference data.

Figure 3:
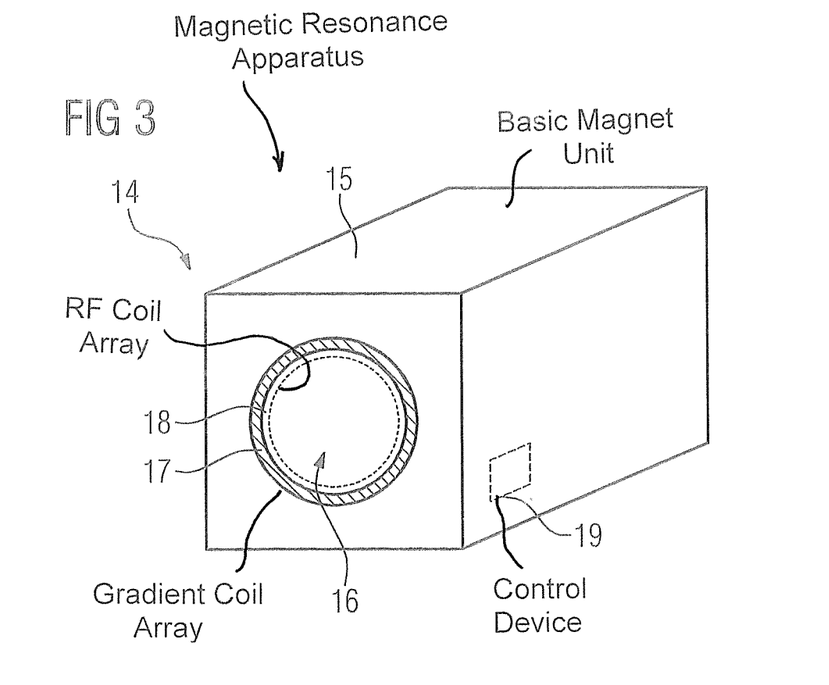
FIG. 3 schematically illustrates a magnetic resonance system in accordance with the invention.

Finally, FIG. 3 shows a schematic diagram of an inventive magnetic resonance apparatus 14. The apparatus has a generally known basic magnet unit 14, which also defines the patient opening 16. The opening is surrounded by a gradient coil array 17 and a radio-frequency (RF) coil array 18. In the present case, several local coils that form the receiving coils (not described in detail) are used for detecting the magnetic resonance signals. However, in the context of the radio-frequency coil array 18, it is also possible to define different portions of the radio-frequency coil array 18 as individual receiving coils.

The operation of the magnetic resonance system 14 is controlled by a control device 19, which is designed to perform the inventive method. This means that the control device 19 controls the different components of the magnetic resonance system 14, in particular also the gradient coil array 17 and the radio-frequency coil array 18, in order to realize the magnetic resonance sequence that is shown, for example, in FIG. 2 and to acquire magnetic resonance data.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance data, comprising:
   operating a magnetic resonance apparatus with a magnetic resonance sequence to acquire magnetic resonance data from a subject situated in the magnetic resonance apparatus;
   in a first portion of said sequence, operating said magnetic resonance apparatus to simultaneously acquire magnetic resonance signals from respective multiple slices of the subject;
   in a second portion of said sequence that follows said first portion, operating said magnetic resonance apparatus to acquire additional data with a spatial resolution that is lower than a spatial resolution at which said magnetic resonance data are acquired, by radiating a radio-frequency pulse and implementing a slice-specific readout of said additional data for respective slices among said multiple slices, at respective readout times that are chronologically offset with respect to each other following a single continuous excitation of nuclear spins in the subject by said radio-frequency pulses with an individual readout for each slice, thereby obtaining a separate set of additional data for each slice among said multiple slices; and
   in a processor, reconstructing a magnetic resonance image of said slices in a reconstruction algorithm dependent on said additional data.

2. A method as claimed in claim 1 comprising operating said magnetic resonance apparatus in said second portion of said sequence to radiate refocussing pulses as said radio-frequency pulses.

3. A method as claimed in claim 1 comprising operating said magnetic resonance apparatus in said second portion of said sequence to activate at least one gradient pulse, preceding readout of said additional data from one of said slices among said multiple slices, that suppresses signals from slices among said multiple slices, other than said one of said slices, during said readout of said additional data from said one of said slices.

4. A method as claimed in claim 1 comprising activating said at least one gradient pulse as spoiler gradient pulse that dephases said signals of said other slices.

5. A method as claimed in claim 1 comprising acquiring said additional data as navigator data that comprises movement information of said subject in real time, and evaluating said movement information to either correct said magnetic resonance data used in said reconstruction algorithm, or to initiate a reacquisition of magnetic resonance data for at least one slice among said multiple slices, before implementing said reconstruction algorithm.

6. A method as claimed in claim 1 comprising using said additional data as reference data in said reconstruction algorithm.

7. A method as claimed in claim 1 comprising using an rs-EPI sequence modified for a blipped CAIPIRINHA technique, as said sequence.

8. A method as claimed in claim 1 comprising using a slice GRAPPA algorithm as said reconstruction algorithm.

9. A method as claimed in claim 1 comprising using an rs-EPI sequence modified for a blipped CAIPIRINHA technique as said sequence, and using a slice GRAPPA algorithm as said reconstruction algorithm.

10. A magnetic resonance apparatus comprising:

a magnetic resonance data acquisition unit;

a control unit configured to operate the magnetic resonance data acquisition unit with a magnetic resonance sequence to acquire magnetic resonance data from a subject situated in the magnetic resonance data acquisition unit;

said control unit being configured to operate said magnetic resonance data acquisition unit in a first portion of said sequence, to simultaneously acquire magnetic resonance signals from respective multiple slices of the subject;

said control unit being configured to operate said magnetic resonance data acquisition unit in a second portion of said sequence that follows said first portion, to acquire additional data with a spatial resolution that is lower than a spatial resolution at which said magnetic resonance data are acquired, by radiating a radio-frequency pulse and implementing a slice-specific readout of said additional data for respective slices among said multiple slices, at respective readout times that are chronologically offset with respect to each other following a single continuous excitation of nuclear spins in the subject by said radio-frequency pulses with an individual readout for each slice, thereby obtaining a separate set of additional data for each slice among said multiple slices; and a processor configured to reconstruct a magnetic resonance image of said slices in a reconstruction algorithm dependent on said additional data.

* * * * *